US008911083B2

(12) United States Patent
Brent

(10) Patent No.: US 8,911,083 B2
(45) Date of Patent: Dec. 16, 2014

(54) CALCULATION OF POST-LENS PRESSURE PROFILE FOR CONTACT LENS

(75) Inventor: Geoffrey Brent, New South Wales (AU)

(73) Assignees: Vision CRC Limited, Sydney, NSW (AU); Novartis AG, Basel (CH)

( * ) Notice: Subject to any disclaimer, the term of this patent is extended or adjusted under 35 U.S.C. 154(b) by 2461 days.

(21) Appl. No.: 10/554,652

(22) PCT Filed: Nov. 19, 2003

(86) PCT No.: PCT/AU03/01548
§ 371 (c)(1),
(2), (4) Date: Oct. 26, 2005

(87) PCT Pub. No.: WO2004/097502
PCT Pub. Date: Nov. 11, 2004

(65) Prior Publication Data
US 2006/0268224 A1 Nov. 30, 2006

(30) Foreign Application Priority Data

May 2, 2003 (AU) ................................ 2003902102

(51) Int. Cl.
G02C 3/00 (2006.01)
G02C 7/00 (2006.01)
G02C 7/02 (2006.01)
G06F 17/50 (2006.01)
G02C 7/04 (2006.01)

(52) U.S. Cl.
CPC ...... *G06F 17/50* (2013.01); *G02C 7/02* (2013.01); *G02C 7/04* (2013.01)
USPC .................................................... 351/159.73

(58) Field of Classification Search
CPC ............ G02C 7/02; G02C 7/04; G02C 7/044; G02B 1/041; A61B 3/107
USPC ........... 351/160 R, 177, 247, 159.72–159.77, 351/159.01
See application file for complete search history.

(56) References Cited

U.S. PATENT DOCUMENTS 3,246,941 A 4/1966 Moss ............................ 351/160
5,760,100 A 6/1998 Nicolson et al. .............. 523/106
(Continued)

FOREIGN PATENT DOCUMENTS

EP 1 496 388 A1 3/2003
JP 11117407 A 4/1999
(Continued)

OTHER PUBLICATIONS

Japan Office Action, Dispatch Date Jul. 6, 2010, Dispatch No. 463835, Japanese Application No. 2004-571202.

(Continued)

*Primary Examiner* — James Greece
(74) *Attorney, Agent, or Firm* — Jian Zhou

(57) ABSTRACT

A system for facilitating contact lens design comprises an input unit for input of design parameters, and a processing unit for calculating a post-lens pressure profile based on the design parameters. The processing unit is arranged, in use, to perform a finite model calculation allowing for large deflection and non-linear geometry effects in the deformation of a model lens shape. Preferably the finite element model calculation utilizes solid elements of modelling the lens shape. A contact comprising a high Young's modulus material such as silicone hydrogel can be designed to have a maximum corneal or limbal post-lens pressure valve of less than 250 Pa.

16 Claims, 14 Drawing Sheets

(56) References Cited

U.S. PATENT DOCUMENTS

| | | | |
|---|---|---|---|
| 5,861,114 A * | 1/1999 | Roffman et al. | 264/2.5 |
| 6,206,520 B1 * | 3/2001 | Jubin et al. | 351/160 R |
| 6,246,468 B1 * | 6/2001 | Dimsdale | 356/4.02 |
| 6,556,691 B1 * | 4/2003 | Lindmark | 382/100 |
| 6,595,639 B1 * | 7/2003 | Ho et al. | 351/177 |
| 2002/0101563 A1 | 8/2002 | Miyamura et al. | 351/160 |

FOREIGN PATENT DOCUMENTS

| | | | |
|---|---|---|---|
| JP | 2001132900 A | | 5/2001 |
| JP | 2002-182167 | | 6/2002 |
| JP | 2002350786 | | 12/2002 |
| JP | 2002350786 A | * | 12/2002 |
| JP | 2003094916 A | | 4/2003 |
| WO | WO 9111154 A1 | * | 8/1991 |
| WO | WO 94/18636 | | 1/1994 |
| WO | WO 03/082162 A2 | | 3/2003 |
| WO | WO 03/087920 A1 | | 3/2003 |

OTHER PUBLICATIONS

Communication.

* cited by examiner

CALCULATION OF POST-LENS PRESSURE PROFILE FOR CONTACT LENS

This application is a national stage filing under 35 U.S.C. 371 of International Application No. PCT/AU2003/001548 filed Nov. 19, 2003, which claims benefits under 35 U.S.C. 119(a)-(d) or 365(b) of Australian Patent Application No. 2003902102 filed May 2, 2003.

FIELD OF THE INVENTION

The present invention relates broadly to a system for facilitating contact lens design, to a method of calculating a post-lens pressure profile, and to a contact lens.

BACKGROUND OF THE INVENTION

To date, contact lens design remains a predominately intuitive, trial-and-error based process. In other words, typically a new lens may be prototyped based on selected parameters, and its suitability is subsequently assessed and improved based on patient trials. This approach has a number of obvious disadvantages, including its inherent limitations for designing contact lenses suitable for "average" patient eyes, as is desired for the mass-manufacture of in particular low cost or disposable contact lenses.

Furthermore, while it has been suggested that the post-lens pressure of a contact lens when on the eye may be a factor determining wearer comfort and giving rise to abrasion of the corneoscleral surface, no reliable and/or practical solution has been devised for determining comparative post-lens pressure profile data for facilitating lens design.

The present invention, in at least preferred embodiments, seeks to provide a system and method for facilitating contact lens design which address one or more of these disadvantages.

SUMMARY OF THE INVENTION

In accordance with a first aspect of the present invention there is provided a system for facilitating contact lens design, the system comprising an input unit for input of design parameters, and a processing unit for calculating a post-lens pressure profile based on the design parameters, wherein the processing unit is arranged, in use, to perform a finite element model calculation allowing for large deflection/non-linear geometry effects in the deformation of a model lens shape.

In a preferred embodiment, the finite element model calculation utilises solid elements for modelling the lens shape.

Preferably, a lens material of the contact lens to be modelled is a high oxygen permeability (Dk) material, and the processing unit is arranged to model the lens at an elasticity representative of the intended lens material. The intended lens material may be modelled at a Young's modulus value representative of silicone hydrogel of a range from about 0.8 to 2 MPa.

In one embodiment, the finite element model calculation comprises second order elements, whereby, in use, second-order properties of the model lens are considered by the system.

The processing unit may be arranged, in use, such that a 2-D axisymmetric geometry is applied to a lens/eye interaction problem in the calculation of the post-lens pressure profile.

In one embodiment, the processing unit is arranged, in use, to calculate the post-lens pressure profile based on a closed eye, steady-state finite element model calculation.

The finite element model calculation may comprise applying a frictionless sliding contact approximation between the model contact lens and the model eye.

In one embodiment, the corneoscleral surface is represented as a rigid body in the finite element model calculation.

A shape of the corneoscleral surface may be approximated based on an ellipsoid-and-sphere formulation in the finite element model calculation.

In accordance with a second aspect of the present invention there is provided a method of calculating a post-lens pressure profile based on design parameters, comprising performing a finite element model calculation allowing for large deflection/non-linear geometry effects in the deformation of a model lens shape.

In a preferred embodiment, the finite element model calculation utilises solid elements for modelling the lens shape.

Preferably, a lens material of the contact lens to be modelled is a high oxygen permeability (Dk) material, and the lens is modelled at an elasticity representative of the intended lens material. The intended lens material may be modelled at a Young's modulus value representative of silicone hydrogel of a range from about 0.8 to 2 MPa.

In one embodiment, the finite element model calculation comprises second order elements, whereby second-order properties of the model lens are considered.

A 2-D axisymmetric geometry may be applied to a lens/eye interaction problem in the calculation of the post-lens pressure profile.

In one embodiment, the post-lens pressure profile is based on a closed eye, steady-state finite element model calculation.

The finite element model calculation may comprise applying a frictionless sliding contact approximation between the model contact lens and the model eye.

In one embodiment, the corneoscleral surface is represented as a rigid body in the finite element model calculation.

A shape of the corneoscleral surface may be approximated based on an ellipsoid-and-sphere formulation in the finite element model calculation.

In accordance with a third aspect of the present invention there is provided a contact lens having a Young's modulus in a range from about 0.8 to 5 MPa and exhibiting a maximum corneal value and/or a limbal peak value in a post-lens pressure profile of less than about 450 Pa, wherein the post-lens pressure profile is calculated using a system or method as defined in the first and second aspect respectively.

Preferably, the maximum value and/or limbal peak value are equal to or less than about 400 Pa.

Advantageously, the maximum value and/or limbal peak value are equal to or less than about 350 Pa.

In one embodiment, the maximum value and/or limbal peak value are equal to or less than about 300 Pa.

In a preferred embodiment, the maximum value and/or limbal peak value are equal to or less than about 250 Pa.

In one embodiment, the Young's modulus is in a range from about 1.2 MPa to 5 Mpa.

Preferably, the contact lens has an oxygen transmissibility of at least about 70 barrers/mm and either an Ionoton Ion Permeability Coefficient of greater than about $0.25 \times 10^{-3}$ $cm^2$/sec or an Ionflux Diffusion Coefficient of greater than about $2.6 \times 10^{-6}$ $mm^2$/min.

In one embodiment, the oxygen transmissibility is at least about 75 barrers/mm.

The oxygen transmissibility may be at least about 87 barrers/mm.

In one embodiment, the Ionoton Ion Permeability Coefficient is greater than about $0.3 \times 10^{-3}$ $cm^2$/sec.

The Ionoton Ion Permeability Coefficient may be greater than about $0.4 \times 10^{-3}$ cm$^2$/sec.

In one embodiment, the Ionflux Diffusion Coefficient is greater than about $3.5 \times 10^{-6}$ mm$^2$/min.

The Ionflux Diffusion Coefficient may be greater than about $6.4 \times 10^{-6}$ mm$^2$/min.

The contact lens preferably has a Hydrodell Water Permeability Coefficient of greater than about $0.2 \times 10^{-6}$ cm$^2$/sec. The Hydrodell Water Permeability Coefficient may be greater than about $0.3 \times 10^{-6}$ cm$^2$/sec. The Hydrodell Water Permeability Coefficient may be greater than about $0.4 \times 10^{-6}$ cm$^2$/sec.

BRIEF DESCRIPTION OF THE DRAWINGS

Preferred embodiments of the present invention will now be described, by way of example only, with reference to the accompanying drawings.

DETAILED DESCRIPTION OF THE EMBODIMENTS

Figure 1:
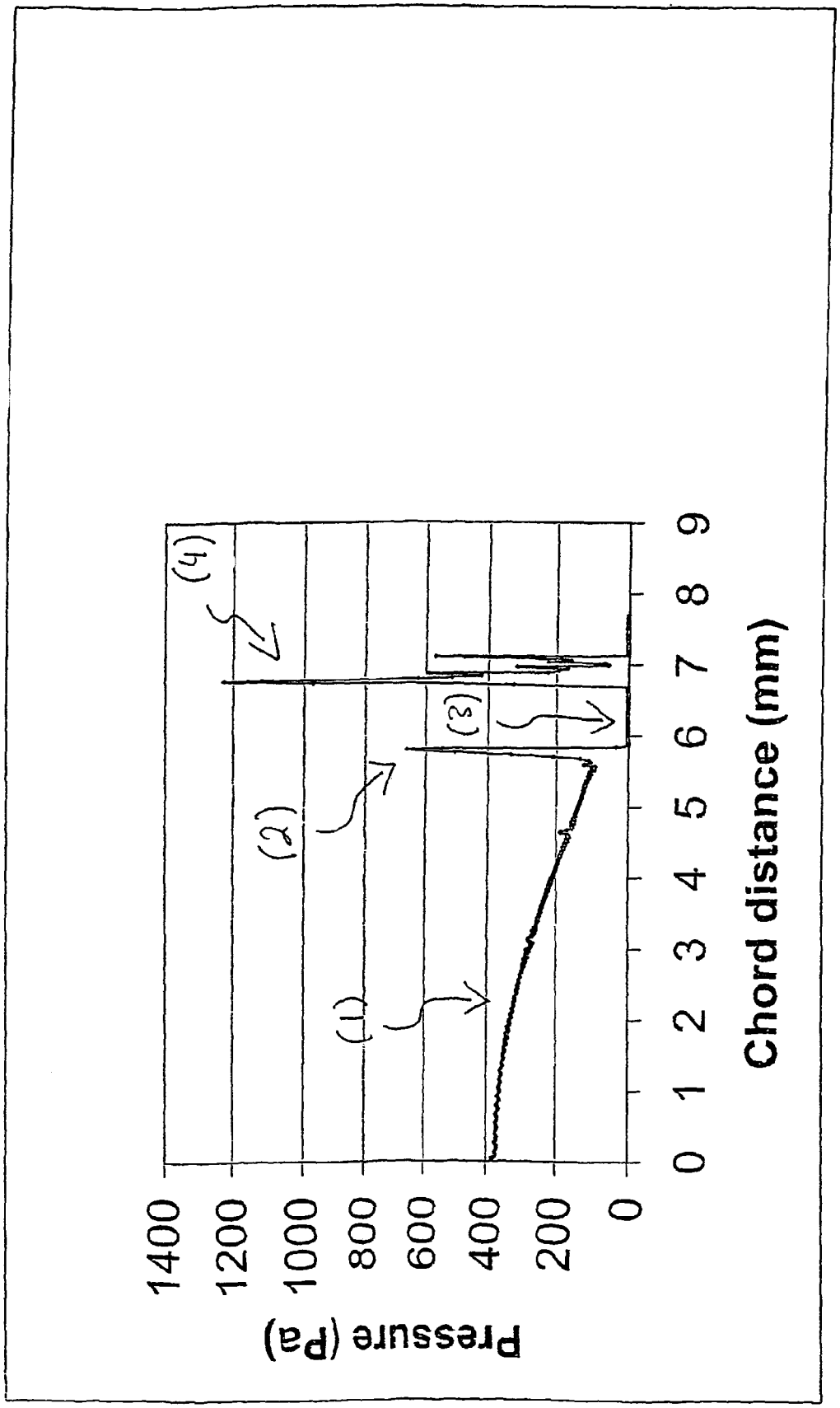
FIG. 1 shows a post-lens pressure profile calculated using a method and system embodying the present invention.

Mechanical stresses caused by soft contact lens wear are implicated in several of the adverse side effects of such wear. At present there is no reliable method in use for predicting the severity of mechanical stresses that will be caused by a given lens design. The interaction between lens and eye is of a complex enough nature that changes to lens designs intended to improve compatibility may have counter-intuitive results. Furthermore, even when a lens is in use, it is extremely difficult to measure interactions with the eye surface because of the small spaces involved and the sensitivity of the eye.

The preferred embodiment described for obtaining maximum and root-mean-square corneal stresses allows a practical way to quantitatively estimate these stresses and thus to assess the risk that a given design will cause mechanically-induced adverse reactions on the eye. The ability to screen designs before manufacturing is particularly advantageous.

The method of the preferred embodiment is useful in assessing potential lens designs before manufacture. It may also be of use in assessing the effects of manufacturing variations in lens shape/material. Because it allows the assessment of lenses based solely on design parameters, it will also be useful in designing lenses to reduce such stresses.

The preferred embodiment is a process and system for predictively quantifying the overall degree of mechanical stress placed on the surface eye as a result of soft contact lens wear. While the eye experiences several different modes of physical stress (open-eye, closed-eye, blinking) and two different types of stress (pressure and shear/friction), some of which are difficult to calculate directly, it has been found by the applicant that the overall impact on the eye can be practically estimated by a nonlinear finite-element model that treats the lens as an elastic body, modelled with solid elements, compressed against a rigid eye by a pressure force on the lens front surface (analogous to a closed-eye scenario) and capable of frictionless contact with the eye. This model will henceforth be called the 'Sliding Contact Closed-Eye' model, or SCCE.

In finite-element work, it is standard practice to model thin bodies (those whose thickness is small, relative to their overall scale and the scale on which the loads placed on such bodies vary) using a set of approximations known as "shell theory". (Related approximations, e.g. "membrane theory", may also be used.) These approximations simplify the task of modelling and greatly reduce the requirement for computing resources, and when used in the right circumstances provide accurate results.

A typical soft contact lens has thickness of about 0.1 mm, diameter of about 14 mm, and overall radius of curvature of about 8 mm, and at first glance this would appear to be an excellent candidate for shell-theory modelling.

However, a more detailed model reveals that compression of the lens against the limbus (juncture between cornea and sclera) yields a small gap between lens and eye, with a high-pressure 'bearing zone' developing at either side of this gap. Near these bearing zones, the post-lens pressure shows dramatic variation within a very small space (approximately 0.1 mm, comparable to the actual thickness of the lens). Further, because the lens and eye are in tangential contact, a small change in the flexure of the lens can cause a large change in the width of this gap, and hence to the pressure that must be borne at either side of the gap.

For this reason, a shell-theory approximation—while convenient for examining some aspects of contact lens fit—is not adequate to accurately calculate pressure in these bearing zones. The inventors have found that a solid-element representation of the lens provides for more accurate predictions of these peak pressure valves compared with shell-theory or other such approximations.

It is also the norm in finite-element work to assume that the deformation of the bodies under examination will be small relative to their overall geometry. This allows a series of approximations to be made that greatly simplify the resulting calculation. (These are sometimes described as "small deflection", "small deformation", or "linear geometry" approximations, among other terms—but since these approximations are the default practice, many analyses use them without comment. Unless an analysis explicitly mentions the consideration of large-deflection/nonlinear geometrical effects, it is likely that small-deflection approximations have been used.)

A soft contact lens undergoes quite large deformation when compressed against the eye, especially in the region of the limbus, where the pressure of the eyelid actually inverts the curve of the lens—behaviour that small-deflection approximations cannot represent. Given the sensitivity of post-lens pressure behaviour to the fit of the lens in this region, accurate representation of this limbal region is vital to accurate calculation of maximum corneal pressures.

For this reason, small-deflection approximations are not adequate to accurately calculate pressure in these bearing zones. It has been found that to properly and accurately model for peak pressures in these critical regions of the eye a model should incorporate non-linear geometrical effects (aka "large-deflection" or "large-deformation" behaviour).

It is noted that straightforward methods for solving such a model can lead to computational problems associated with rigid-body motion and/or snap-through problems. Thus, two load-step modifications to eliminate these problems are also described below as an optional enhancement in the preferred embodiment.

The preferred embodiment uses finite-element modelling techniques. The eye is treated as a rigid, inflexible body, which may be shaped to represent either a particular patient's eye shape or a shape representative of a number of patients. The lens is represented as an elastic solid, with shape based on designs or on measurements from actual lenses. Required material properties are elastic modulus and Poisson's ratio. In the preferred embodiment, a default value of 0.3 has been used for the Poisson's ratio. However, it is noted that alternatively, the Poisson's ratio may be determined from actual measurements. Significantly, it has been found by the applicant that a representation capable of including large-deflection geometric effects must be used in order to achieve reliable, and comparative pressure values.

The involvement of the tear fluid is represented in the preferred embodiment by treating the lens back surface as capable of frictionless contact with the eye. Optionally friction/shear terms may be included in other embodiments to represent the resistance of the tear film to shear forces. Eyelid forces are represented by a pressure load applied to the front surface of the lens (a default eyelid load is 200 Pa distributed evenly over the front of the lens).

Attempting to solve this model via standard static-analysis techniques can lead to convergence failures due to zero-stiffness and/or "snap-through" problems, as mentioned above. Zero-stiffness problems occur because initial contact area (and hence initial contact stiffness) between the undeformed lens and the eye is usually zero. Snap-through problems occur when deformation of the lens under pressure load reduces its internal stiffness to zero.

These may be avoided by creating the lens in its undeformed shape, separated from the eye by a small distance (e.g. 1 mm) and then applying a 6-step loading sequence in the preferred embodiment. However, it is noted some of the below steps are optional, and may not be required where no convergence failures due to zero-stiffness and/or "snap-through" problems are experienced, or where different techniques are used to overcome such convergence failures.

1. Constrain lens nodes on the centre of the lens to remain on the central axis of the eye (if an axisymmetric eye shape is used, this is the axis of rotational symmetry) and to prevent rotation around this axis. Constrain lens back centre node to prevent displacement in any direction.

2. Apply a 'stretching' load (i.e. away from the central axis, and at right angles to it) to lens nodes. This in particular is an optional step to avoid snap-through, and may be omitted where snap-through problems do not occur. The magnitude and distribution of the stretching load necessary to prevent snap-through depends on the lens, and must generally be discovered through trial-and-error.

3. Displace lens back centre node to coincide with the eye front surface centre node, thus creating contact between lens and eye.

4. Apply eyelid pressure load to lens front surface.

5. Remove displacement condition applied to lens back centre node in step 3.

6. Remove centripetal load applied in step 2, if applicable.

Calculation of post-lens pressure distribution subsequent to step 6 then provides a profile of post-lens pressure. Because pressure results in tear-film thinning, leading to increased shear resistance, this same profile is also an indicator of relative shear force magnitudes on blinking. This profile will henceforth be referred to as the 'SCCE Impact Profile' (SCCEIP). The SCCEIP can then be used as an indicator of lens-induced forces on the eye. For example, a weighted-mean SCCEIP (root-mean-square or other mean) provides an indicator of overall stresses on the eye, while maximum corneal SCCEIP value and SCCEIP at specific X-values give indicators of more localised effects.

Figures 1, 7A:
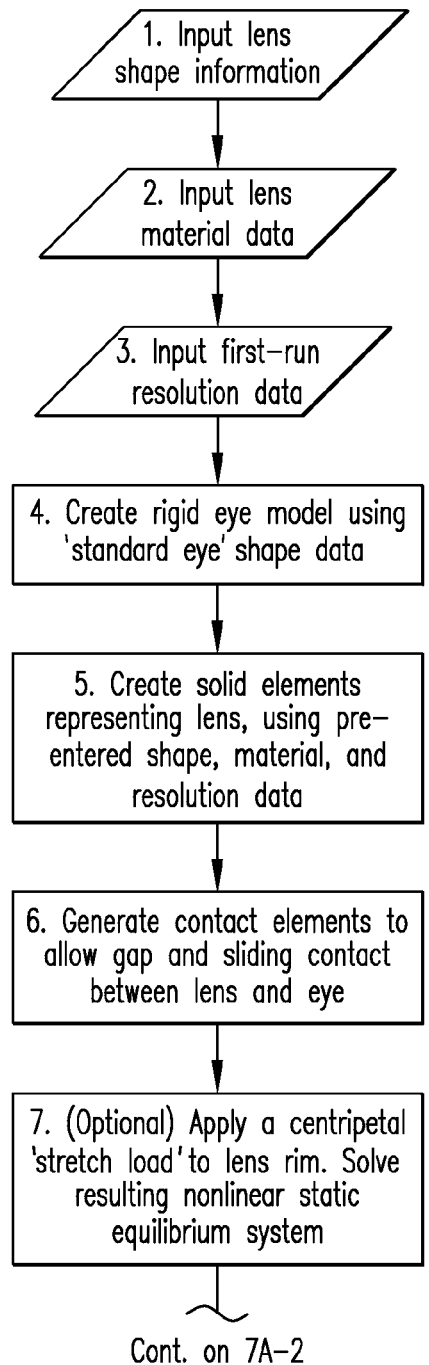
FIGS. 7A and 7B shows a flow chart depicting the process steps to be following developing lens designs according to the invention.
Figures 2, 7A:
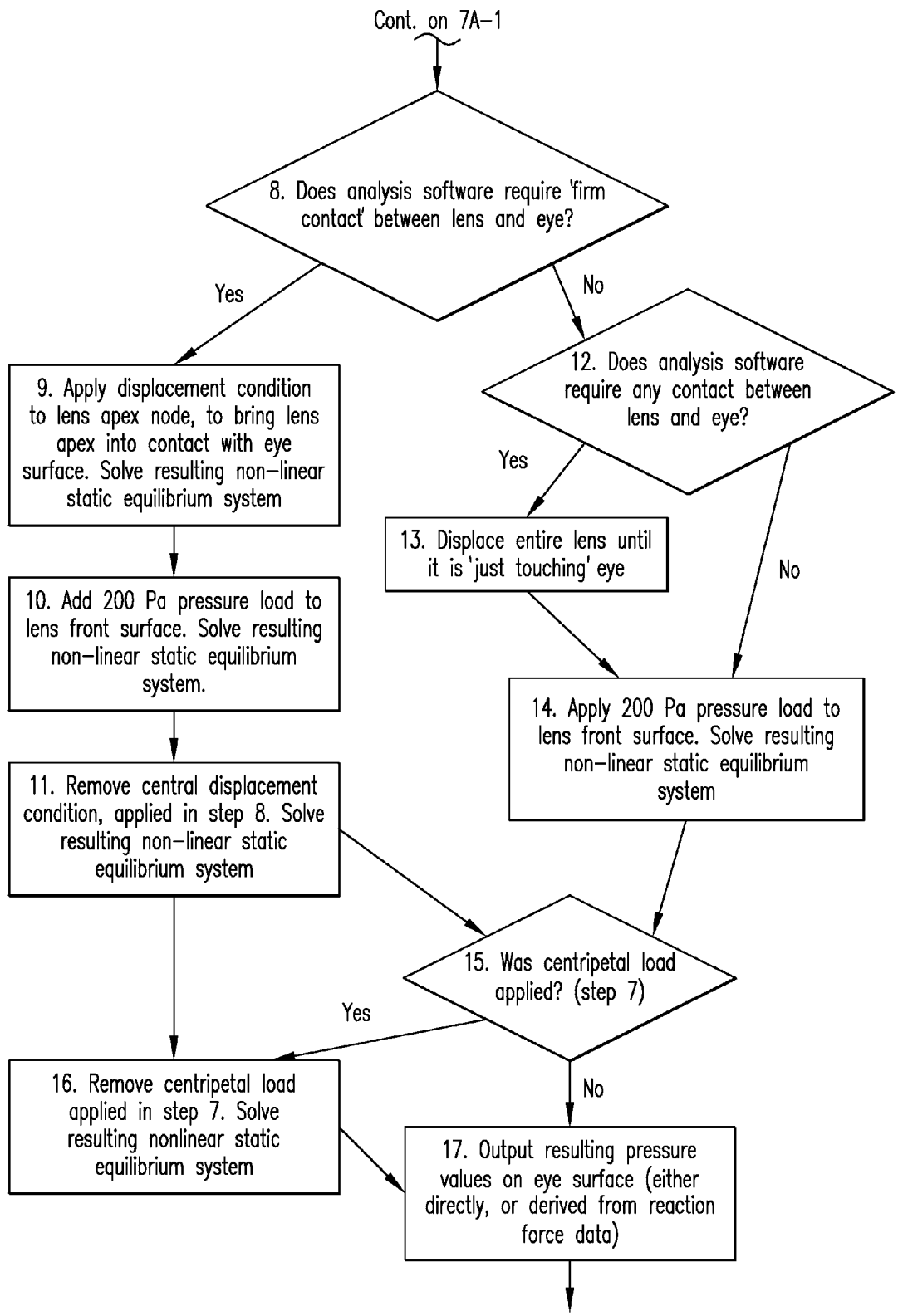
Figure 7B:
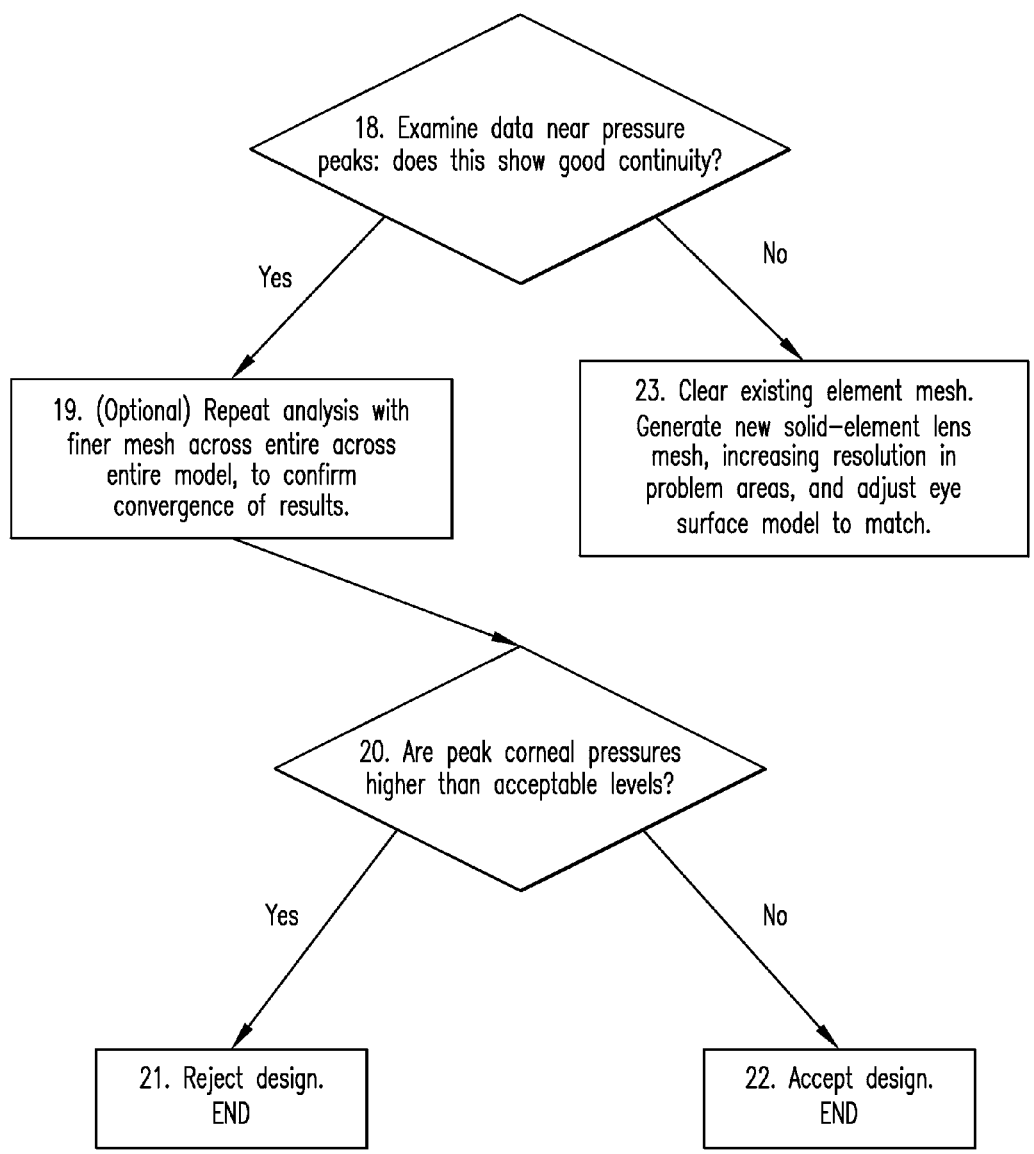

The manner in which the finite element calculation is performed is set out in the flowchart which is contained in FIGS. 7A and 7B. The flowchart is basically self explanatory and depicts how the lens and eye parameters are first defined in the system, whereafter a pressure of 200 Pa is applied evenly across the surface of the lens. The resulting pressure peaks are then examined. If the data adjacent the pressure peaks does not show acceptable continuity the resolution is increased (see box 23) and the calculation is repeated until acceptable resolution is obtained. Thereafter the corneal pressure peaks are analysed, and if too high the lens design is abandoned, but if acceptable the design will be accepted (boxes 21 and 22) for further testing, such as manufacturing of a physical lens for clinical analysis. An advantage of the system of the invention will be self evident, that is, lens designs which would result in unacceptably high pressure peaks can be discarded at an early stage, prior to incurring the expense and inconvenience of the manufacture of physical lenses.

It will be appreciated by a person skilled in the art that the method of the preferred embodiment can be implemented in a computer system for facilitating contact lens design. In an example embodiment, the method was implemented on a Pentium III 500 MHz PC.

The default eyeshape used in the preferred embodiment was based on both published literature and lens manufacturers. Differences between manufacturer-supplied information and published literature were not large. It was considered appropriate to test lens performance under the same assumptions used in design; thus, where manufacturers' data differed from published values, the former were preferred.

Under the ellipsoid cornea/spherical sclera approximation, the parameters defining eye shape are central corneal radius of curvature r, corneal shape factor P, corneal diameter d, and scleral radius of curvature s. A discussion of these descriptors and their relationship to others is given by Lindsay R. and Atchison D. (1998) "Descriptors of corneal shape", *Optom. Vis. Sci.* 75, 156-158. Please note that, while the definition Lindsay gives for P is the same used herein, the "shape factor" to which Lindsay refers is not the same quantity. It is instead the "Wesley-Jessen shape factor". The Wesley-Jessen shape factor is defined as $e^2$, the square of the eccentricity of the cornea. This definition is somewhat problematic, since the Wesley-Jessen shape factor may in fact be negative, implying an imaginary-number value of e. An oblate ellipse has a Wesley-Jessen shape factor of less than zero, a circle has a Wesley-Jessen shape factor of 0, and a prolate ellipse has a Wesley-Jessen shape factor between 0 and 1.

However, conventional notation defines "shape factor" P as $1-e^2$ (Guillon, M., Lydon, D. P. M. and Wilson, C. (1985) "Corneal topography: a clinical model", *Ophthalmol. Physiol. Opt.*, 6, 47-56). A shape factor of 1 indicates a spherical cornea; values greater than 1 indicate a prolate (steepening) ellipse, values between 0 and 1 an oblate (flattening) ellipse. This is the definition used in the example embodiment.

An example of a SCCE Impact Profile calculated utilising the method and apparatus of the preferred embodiment is shown in FIG. 1. The model lens has a spherical back curve (radius of curvature 8.7 mm, diameter 14 mm, P=1), a spherical front curve (radius of curvature 8.8 mm, diameter 14 mm, P=11), a central thickness of 0.1 mm (which is also the thickness elsewhere on the lens) and it was modelled at Young's modulus 1 Mpa, Poisson's ratio 0.3. The SCCE Impact Profile in FIG. 1 can be characterised by four features:

(1) A relatively smooth central zone with only gradual change in pressure, out to approximately 5 mm from apex. Theoretical and practical considerations make it difficult to accurately estimate pressure within about 0.1 mm of the apex; for this reason anomalous results inside the region are not considered significant.

(2) A pressure peak ("limbal peak"), inside and within about 2 mm of the junction of corneal and scleral curves, immediately followed by:

(3) A zero pressure region, ending abruptly in:

(4) A second peak (or possibly multiple peaks) on the scleral region, outside the junction of corneal and scleral curves.

Since positive pressure implies contact, it can be seen that the type of pressure profiles shown in FIG. 1 indicate close conformity between lens and eye, with lens/eye contact occurring everywhere except between the two peaks (2) and (3) identified above. It is noted that a SCCE model prediction of "contact" does not imply that the tear film completely vanishes, rather that its thickness in the region of "contact" is too small to significantly influence lens/eye geometry.

Figure 2:
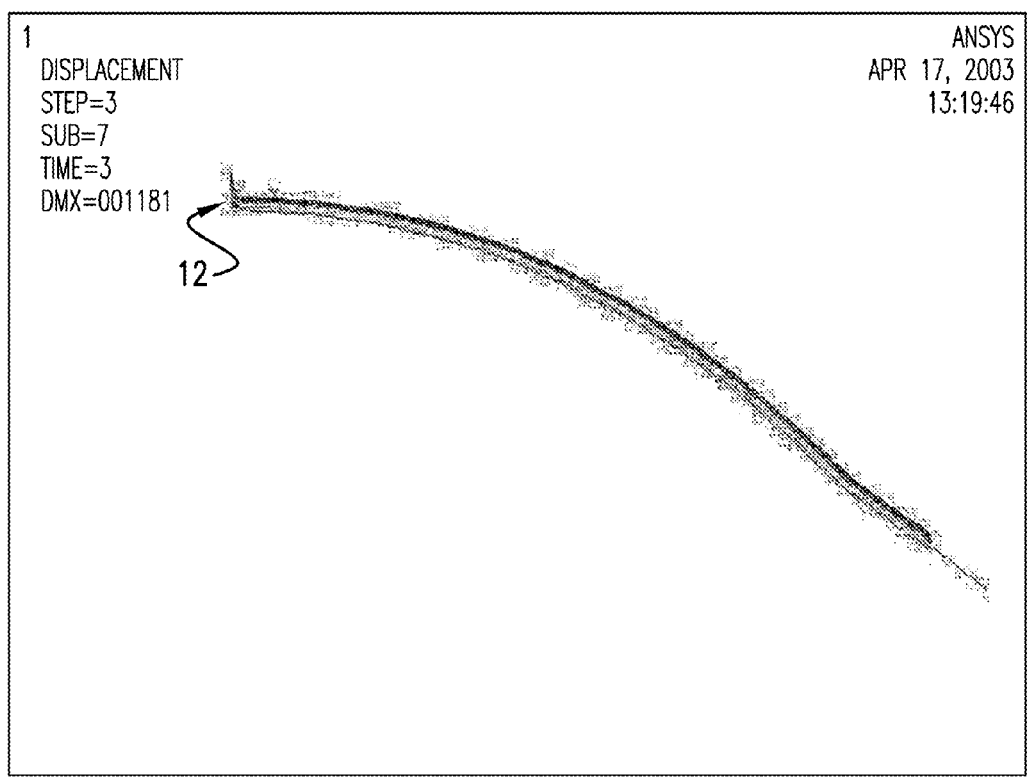
FIG. 2 displays the close conformity between the contact lens with a standard eye, for the pressure profile of FIG. 1.

FIG. 2 displays the deformed lens shape (12) associated with the pressure profile of FIG. 1.

Figure 3:
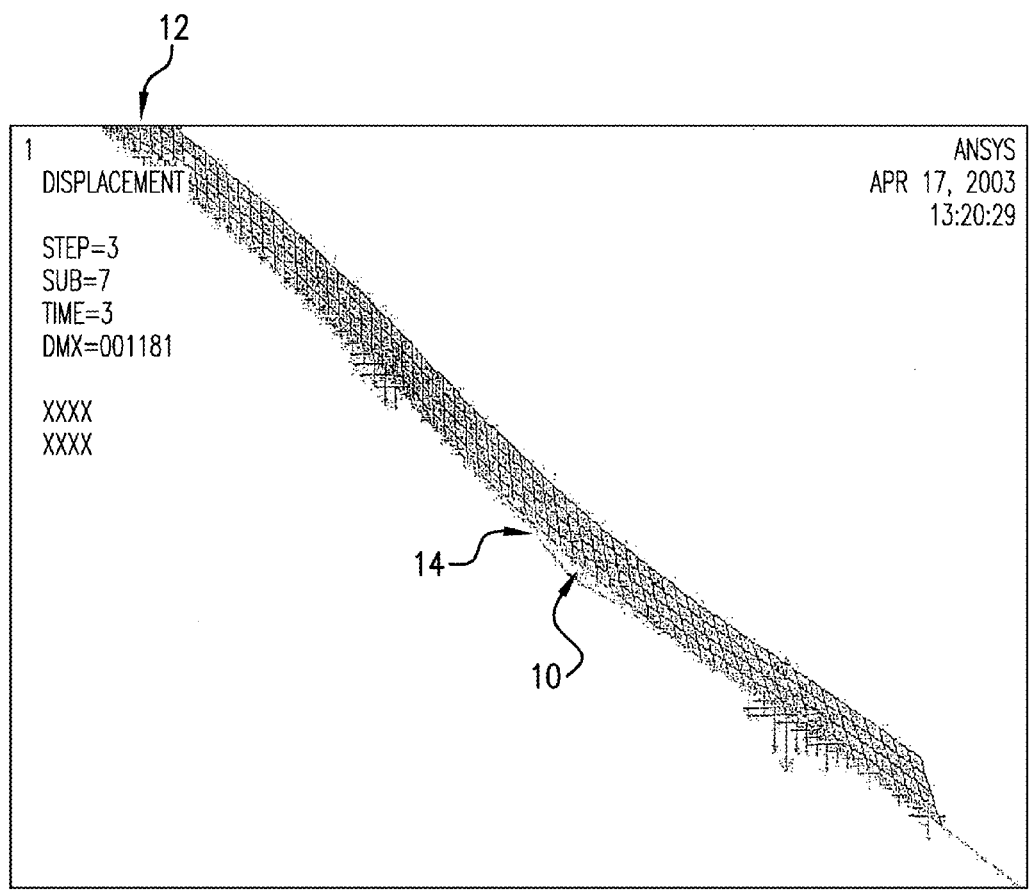
FIG. 3 shows a detail of FIG. 2.

FIG. 3 shows a close up of the limbus region from FIG. 2. This is the only region in which a significant gap (10) appears between lens (12) and eye (14). Profiles of the type shown in FIG. 1 were observed for most of the sample lens designs to which the method and system of the preferred embodiment was applied.

Figure 4:
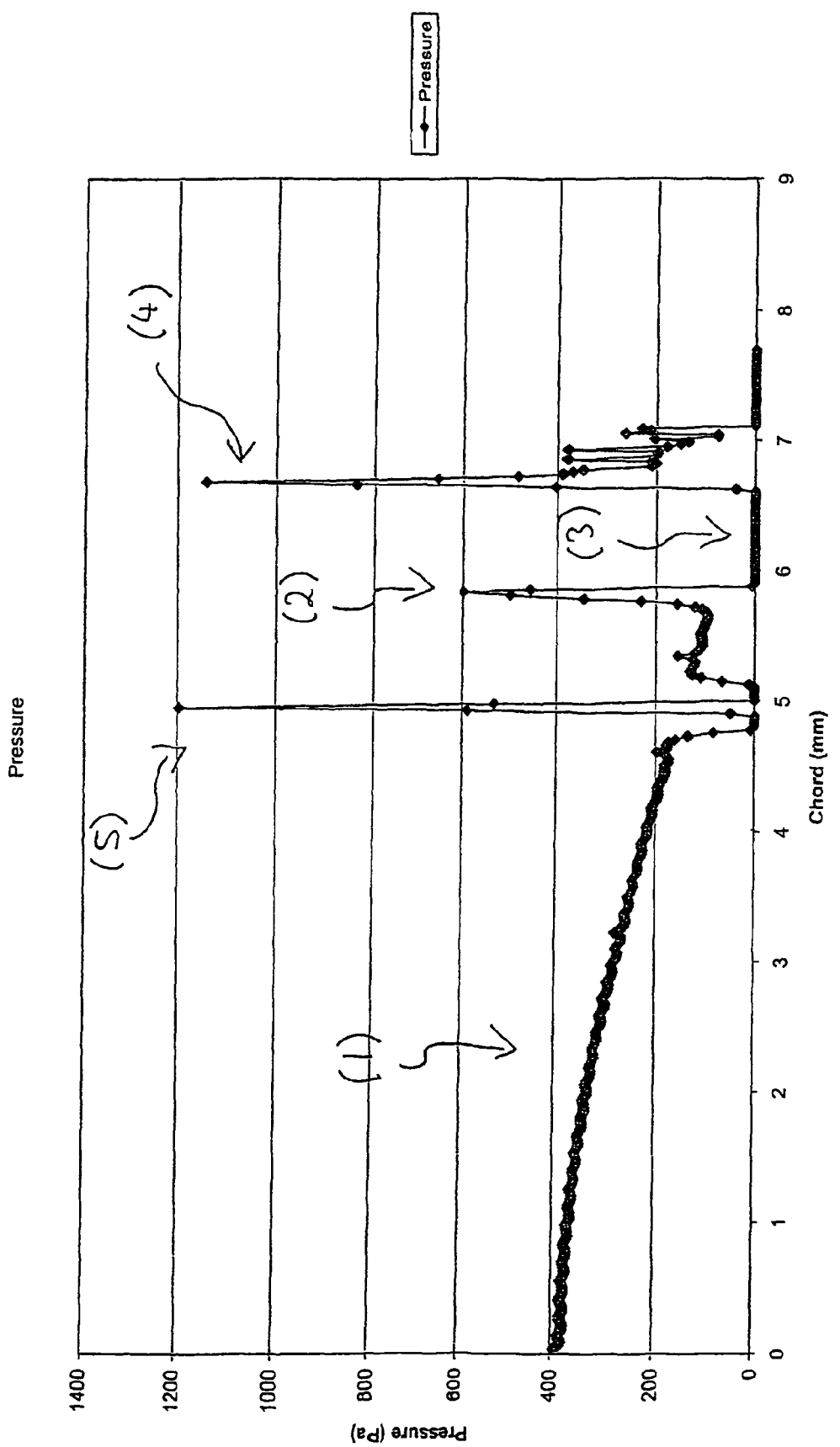
FIG. 4 shows another post-lens pressure profile embodying the present invention.

A second type of profile, shown in FIG. 4, was observed for another lens. That lens was a silicone hydrogel lens of the same central thickness as the lens described above with reference to FIGS. 1 to 3, but with a multi-curve back-surface having a blended junction zone at 5 mm from the centre. The front surface of this lens was a single spherical curve surface with radius of curvature 8.8 mm, diameter 14 mm P=1.

The central region of the back-surface (with a diameter of 10 mm) was a spherical curve with radius of curvature of 8.7 mm, P=1 and the peripheral back-surface region was a spherical curve with radius of curvature of 8.8 mm, P=1, diameter 14 mm, with the junction smoothed by a blank curve of radius 5 mm. Central thickness was 0.1 mm and the lens was modelled at an elasticity of 1.0 MPa.

It is generally similar to the first profile (see FIG. 1), but with one extra feature: a very narrow, high intensity pressure peak (5) ("paralimbal peak") at 5.0 mm (corresponding to the back surface junction on this lens design) accompanied by a zero pressure region to either side of this peak (5).

The geometrical differences between Type 1 (FIG. 1) fits and Type 2 (FIG. 4) fits were much less pronounced than the pressure differences. Both showed close conformity between lens and eye, except for an obvious gap at the limbus.

Figure 5:
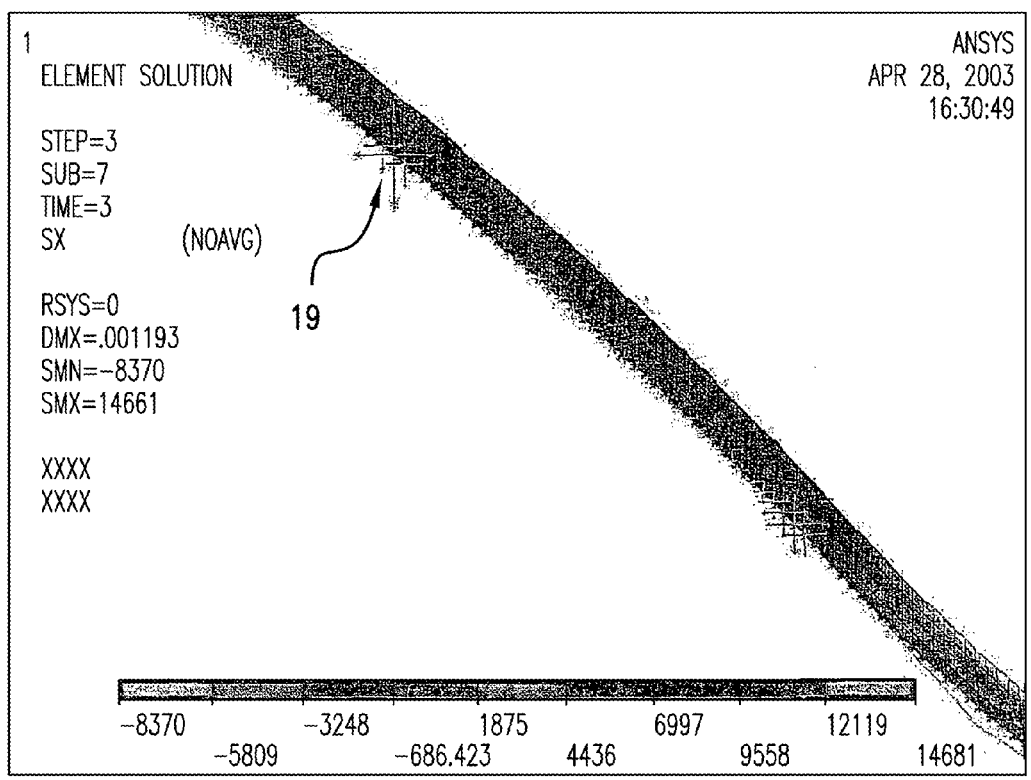
FIG. 5 displays a detail of the conformity of the contact lens with the standard eye for the pressure profile of FIG. 4.

The paralimbal peak (5) in a Type 2 profile (FIG. 4) occurs at the back surface junction zone (large arrows (19), upper left of FIG. 5). To either side of this narrow region of contact, a gap exists between lens and eye (corresponding to the zero pressure zones, as described above), but (as evidenced by FIG. 5) this gap may be too small to be seen by visual inspection.

Both these profile types show that the post-lens pressure distribution is much more uneven than the evenly-spread 200 Pa eyelid pressure that drives it, in the example embodiment. While the exact effect will depend upon the actual magnitude and distribution of eyelid pressure, this is a clear demonstration that the presence of a soft contact lens greatly alters the distribution of eyelid forces upon the surface of the eye.

The embodiments described above with reference to FIGS. 1 to 5 were based on a "standard eye" model, as mentioned above. However, it will be appreciated by a person skilled in the art that the present invention can be implemented to model for non-standard eye shapes, thus for example facilitating design of custom made contact lenses.

It will be appreciated by the person skilled in the art that the profiles (FIG. 1, FIG. 4) can provide a number of comparison indicators in the analysis of contact lens designs. For example, the maximum corneal value in the pressure profile may be used. It is noted that while in the example profile shown in FIG. 1 the limbal peak (2) represents the maximum corneal pressure, these two measures are not always equivalent. Rather, as shown in the profile of FIG. 4, they may differ. In that example, the para-limbal peak (5) represents the maximum corneal pressure value. Accordingly, where the limbal peak does not represent the maximum corneal pressure, both may be useful.

Superior epithelial arcuate lesions (SEALs, sometimes known as "soft lens arcuate keratopathy" or "epithelial splits") present as a thin arcuate white lesion in the superior cornea; within 1-3 mm of the superior limbus between 10 and 2 o'clock, in an area normally covered by the superior eyelid. The edges of the lesion are often irregular and may be slightly roughened or thickened, appearing as heaping of the corneal epithelium. There is normal corneal epithelium separating the lesion from the limbus. The lesion can typically be up to 0.5 mm wide and from 1-5 mm in length. SEALs can be unilateral or bilateral but are usually asymptomatic. Some patients may acknowledge some discomfort on direct questioning. Although injection of the limbal vessels and underlying diffuse infiltrates are occasionally noted, there is usually no associated inflammation."

SEALs may be classified according to their location on the eye, as "limbal" (occurring within 0.8 mm of the limbus) or "para-limbal" (more than 0.8 mm from limbus). The overall incidence of limbal SEALs (LSEALs) in test data considered by the applicant was much higher than for paralimbal SEALs (PSEALs)—30 LSEALs against only 8 PSEALs—and this allows more information to be gleaned from analysis of LSEALs.

LSEAL data were compared with limbal peak value of post-lens pressure ($P_3$) via Poisson regression, exposure measured as eye years of wear. Poisson regression was chosen over linear regression because the nature of the data involved (small numbers of SEALs and different exposure periods for different lenses) make the linear regression assumptions of normally-distributed, equally-weighted data inappropriate here.

This regression showed a highly significant (p<0.0001) positive correlation between $P_3$ and rate of LSEALs:
  Observations=5
  LR chi-squared=23.99
  Pseudo R-squared=0.41
  The relationship calculated is:

$$\text{SEAL rate per eye year} = \exp(\alpha + P_3 * \beta)$$

$\alpha = -7.63$, 95% CI [−9.24, −6.02], p=0.000
$\beta = 0.00559$, 95% confidence interval [0.00354, 0.00765], p=0.000
Substituting $\alpha = -7.63$, $\beta = 0.00560$, the above relationship simplifies to:

$$L = \exp(P_3 * 0.00560 - 7.63)$$

where L is the rate of LSEALs per eye year and $P_3$ is the limbal peak pressure measured in pascals.

However, pseudo-$R^2$ (0.41) and goodness-of-fit chi-squared measures suggest that the model fit is poor and could be improved.

A quadratic approach using $P_3^2$ in addition to $P_3$ improved fit while maintaining significance at p<0.0001:
Observations=5
LR chi-squared=38.80
Pseudo R-squared=0.66

Predicted SEAL rate per eye year=$\exp(\alpha+\beta*P_3+\gamma*P_3^2)$ $\alpha$=−27.58, 95% CI [−39.48, −15.68], p=0.000
$\beta$=0.0574, 95% CI [0.0277, 0.0871], p=0.000
$\gamma$=−0.0000325, 95% CI [−0.0000507, −0.0000142], p=0.000

Substituting these values gives the formula:

Rate of LSEALs per eye year=$\exp(-27.58+P_3*0.0574-P_3^2*0.0000325)$ ($P_3$ in pascals.)

Table 1 shows the predictions of this formula, based on pressure and eye year exposure, against actual recorded incidence of LSEALs.

TABLE 1

Occurrences of SEALs predicted by quadratic Poisson formula

| Lens | Predicted LSEALs | Actual LSEALs |
|---|---|---|
| A | 4.85 | 5 |
| B | 0.31 | 1 |
| D | 1.01 | 3 |
| E | 3.37 | 2 |
| G | 22.16 | 21 |

Note that this relationship is based on data with $P_3$ values between 530 Pa and 1,000 Pa and that, although the coefficients themselves are strongly significant, the proportional error in those coefficients is quite large. For this reason applying the formula above blindly to lenses with $P_3$ values much exceeding 1,000 Pa, or much less than 530 Pa, may not provide reliable results.

These results in Table 1 suggested two further avenues of inquiry: predicting SEAL incidence for lenses for which clinical data is not yet available, and attempting to identify lens design factors that will minimise SEAL incidence.

At present, it is not possible to solve the problem of oxygen transport with low-elasticity lenses. Thus, it is important to be able to produce low-mechanical-impact lenses from high-elasticity materials. The preferred embodiment now sets out easily testable criteria for low-impact lenses, allowing the assessment of any soft lens design against these criteria and the identification of lenses that will give a low incidence of mechanically-induced adverse reactions.

The chief design steps, in an example embodiment, are (1) the identification of peak corneal SCCEIP value and/or limbal peak value as test criteria for lens designs (combined with the definition of 'standard conditions' for measurement of this value, as e.g. described above) and (2) the generation of lens designs that produce low peak-corneal-SCCEIP value and/or low limbal peak value when tested at elasticity values in a range from about 0.8 to 5MPa.

Currently the mechanical impact of lens wear on the eye is typically assessed post res, by fluorexon pattern examination and by patient outcomes. While the preferred embodiment is not expected to eliminate clinical trials, it can streamline the design/testing/redesign process by allowing designs to be reliably and comparably assessed at a much earlier stage of development, weeding out bad designs and identifying promising ones before these are put into production and testing.

U.S. Pat. No. 5,965,631 describes a class of soft contact lenses (SCLs) that provide a high level of oxygen flow to the cornea, greatly reducing the risk of certain complications associated with soft contact lens wear. However, within or without the class of lenses described in U.S. Pat. No. 5,965, 631, mechanical lens/eye interactions remain a problem, causing complications such as corneal erosion and superior epithelial arcuate lesions. U.S. Pat. No. 5,965,631 provides an explanation of terms relating to certain criteria and lens performance characteristics as used in this specification.

The optimisation of lens materials for characteristics such as oxygen and ion permeability often places limits on the mechanical properties of lenses—in particular, such optimisation often results in materials with high Young's modulus (E), making these lenses stiffer and thus exacerbating the effects of mechanical interactions. Hydrogel materials (e.g. pHEMA) offer Young's modulus values of 0.5 MPa or lower, but have poor oxygen transport characteristics. Silicone hydrogel materials typically have Young's modulus in excess of 0.8 MPa, but offer better oxygen transport.

It would be desirable to have a way of producing "low-impact" lenses (i.e. those that place little physical stress on the eye) from materials of high Young's modulus. The preferred embodiment sets out criteria for low-impact lenses, based on the 'SCCEIP' method of lens assessment described above, and has identified an example of such designs.

In the following, an example classification of "low-impact" lenses based on criteria derived from the method and system of the preferred embodiment described above, are suggested:

A 'Class 1A' lens design is one which, when measured under standard conditions and at nominal elastic modulus E=1 MPa, produces maximum corneal SCCEIP intensity and/or limbal peak value of less than 450 Pa.

A 'Class 1B' design is one which, when measured under standard conditions and at nominal elastic modulus E=1 MPa, produces maximum corneal SCCEIP intensity and/or limbal peak value of less than 400 Pa.

A 'Class 1C' design is one which, when measured under standard conditions and at nominal elastic modulus E=1 MPa, produces maximum corneal SCCEIP intensity and/or limbal peak value of less than 350 Pa.

A 'Class 1D' design is one which, when measured under standard conditions and at nominal elastic modulus E=1 MPa, produces maximum corneal SCCEIP intensity and/or limbal peak value of less than 300 Pa.

A 'Class 1E' design is one which, when measured under standard conditions and at nominal elastic modulus E=1 MPa, produces maximum corneal SCCEIP intensity and/or limbal peak value of less than 250 Pa.

Classes 2A-2E are defined as for 1A-1E respectively, except that measurement uses nominal elastic modulus E=1.2 MPa.

Classes 3A-3E are defined as for 1A-1E respectively, except that measurement uses nominal elastic modulus E=1.5 MPa.

Classes 4A-4E are defined as for 1A-1E respectively, except that measurement uses nominal elastic modulus E=1.7 MPa.

Classes 5A-5E are defined as for 1A-1E respectively, except that measurement uses nominal elastic modulus E=2 MPa.

'Standard conditions': The lens design is modelled, at specified elastic modulus and with Poisson's ratio of 0.3, on a 'standard eye' shape defined with aspheric cornea (central radius 7.8 mm, diameter 12.5 mm, P-value 0.75, and scleral radius 12 mm). Eyelid pressure is represented by a constant 200 Pa, applied evenly over the front surface of the lens. 'Maximum corneal SCCEIP intensity' is defined as the maximum value of calculated post-lens pressure on the eye region within the corneal diameter.

Figure 6:
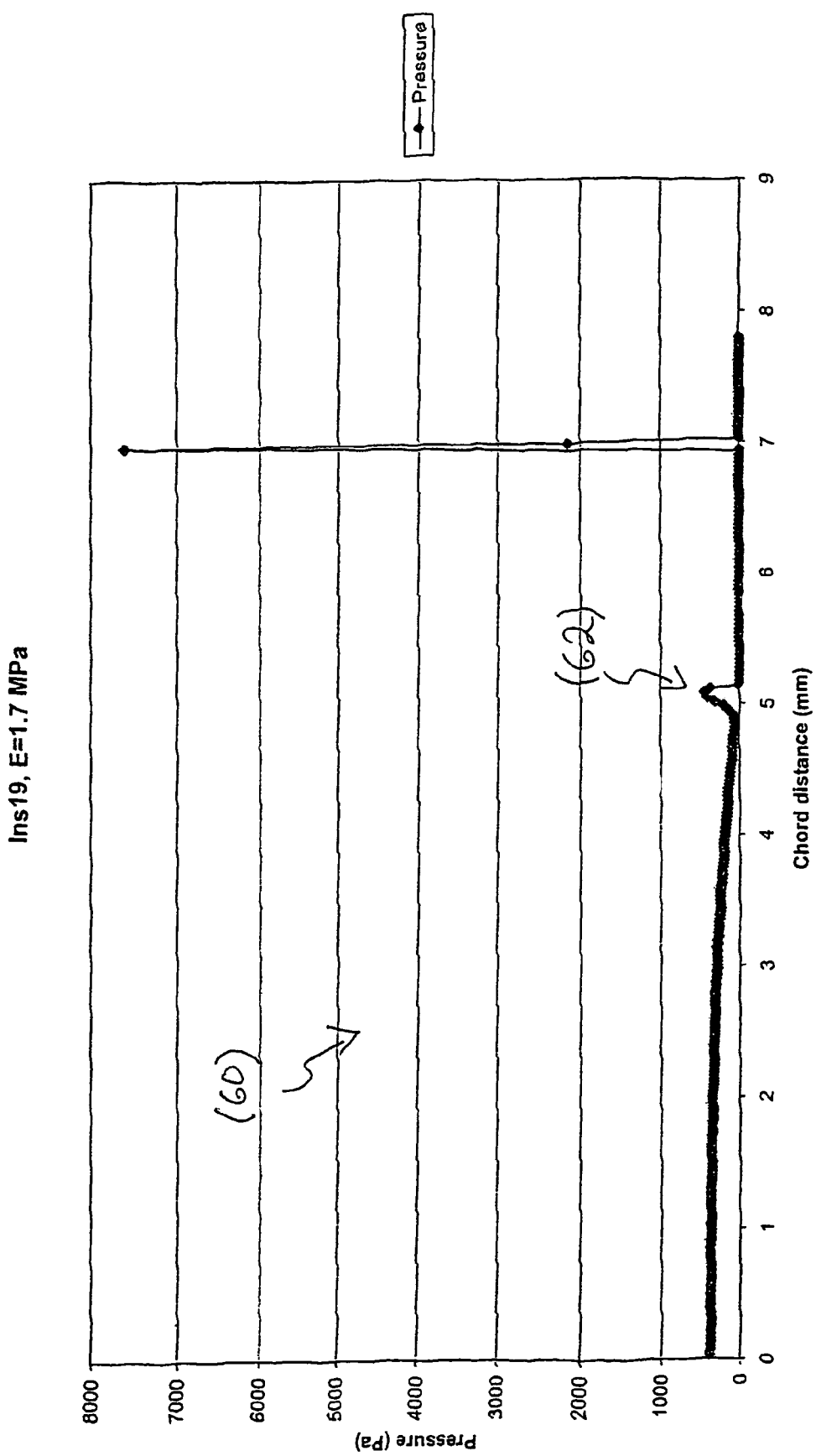
FIG. 6 shows the post-lens pressure profile of a contact lens design embodying the present invention.

An example lens design to satisfy class 4A was realised, and the resulting post-lens pressure profile (60) is shown in FIG. 6. Notably, the maximum value of corneal pressure, occurring at a limbal peak 62 at x=5.1 mm (approx.) in the example lens design, is 431 Pa. The design was modelled at a nominal elastic modulus E=1.7 MPa.

The design incorporates a combination of several curves on front and back surfaces. Central (optical zone) curves are aspheric, as described below; all peripheral curves are spherical (i.e. P-1):

Front optical zone: Central radius-of-curvature 8.93 mm, curve diameter 7.8 mm, P=0.97.

Front peripheral curve #1: Radius-of-curvature 8.90 mm, curve diameter 10.0 mm, P=1.

Front peripheral curve #2: Radius-of-curvature 8.95 mm, curve diameter 13.1 mm, P=1.

Front peripheral curve #3: Radius-of-curvature 8.80 mm, curve diameter 13.7 mm, P=1.

Front peripheral curve #4: Radius-of-curvature 8.70 mm, curve diameter 13.8 mm, P=1.

Front peripheral curve #5: Radius-of-curvature 8.60 mm, curve diameter 14.0 mm, P=1.

Front peripheral curve #6: Radius-of-curvature 8.80 mm, curve diameter 14.2 mm, P=1.

Back optical zone: Central radius-of-curvature 8.38 mm, curve diameter 13.8 mm, P=0.84.

Back peripheral curve: Radius-of-curvature 10.5 mm, curve diameter 14.2 mm, P=1.

Central thickness: 0.08 mm.

This model did not incorporate 'blend zones' between the curves specified above, nor was the lens edge rounded. In practice a contact lens design would likely include blend zones and a rounded edge, but these details are considered unlikely to have much effect on corneal SCCEIP results and so are omitted from modelling for simplicity's sake. (Blend zones may be significant to corneal SCCEIP where a junction between back-surface curves contacts the cornea, but this is not the case with the above lens since the only back-surface junction lies outside the cornea.)

Figure 8:
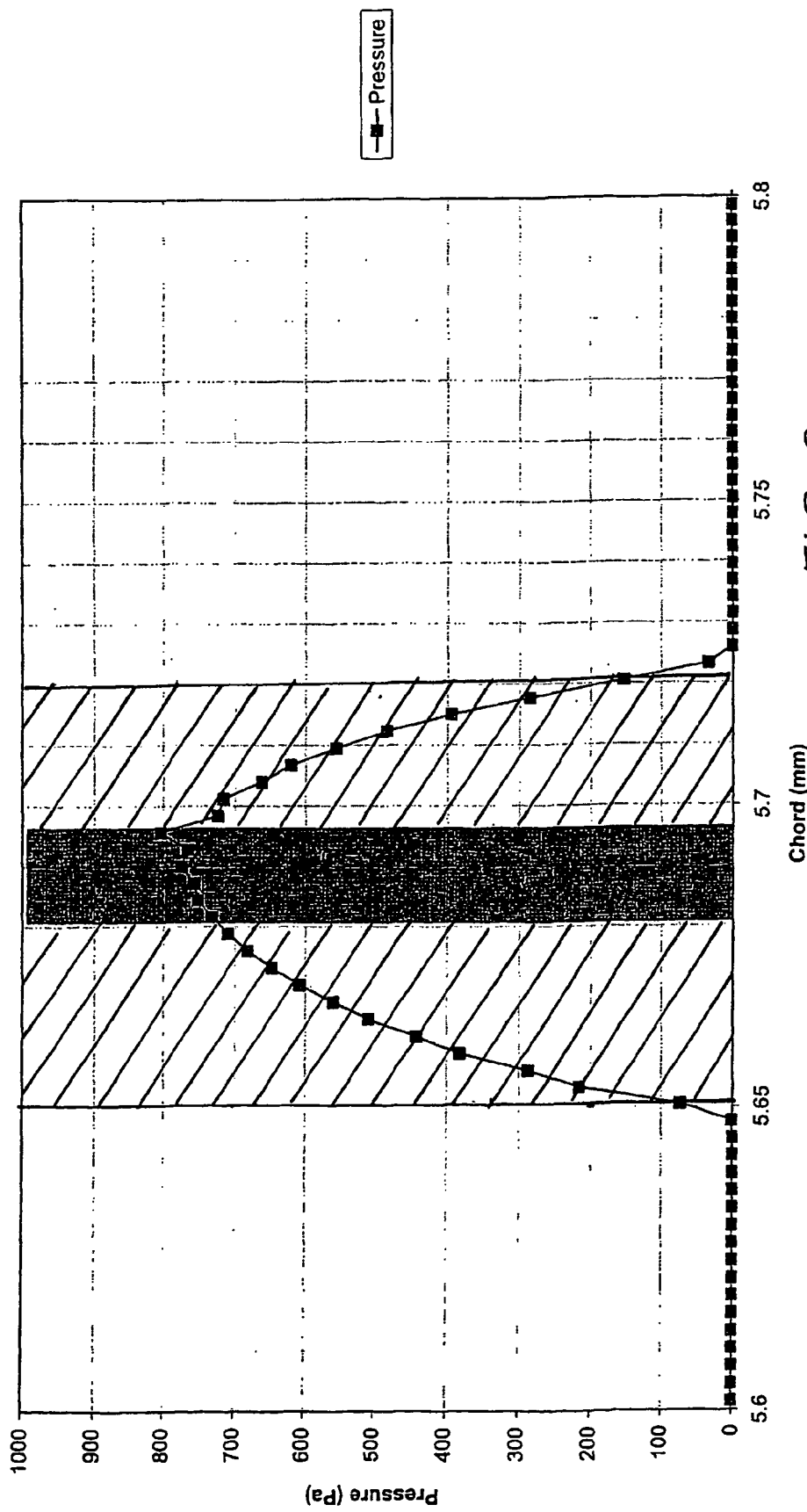
FIGS. 8 to 12 depict example pressure plots at high pressure points in the eye for four different lens designs.
Figure 9:
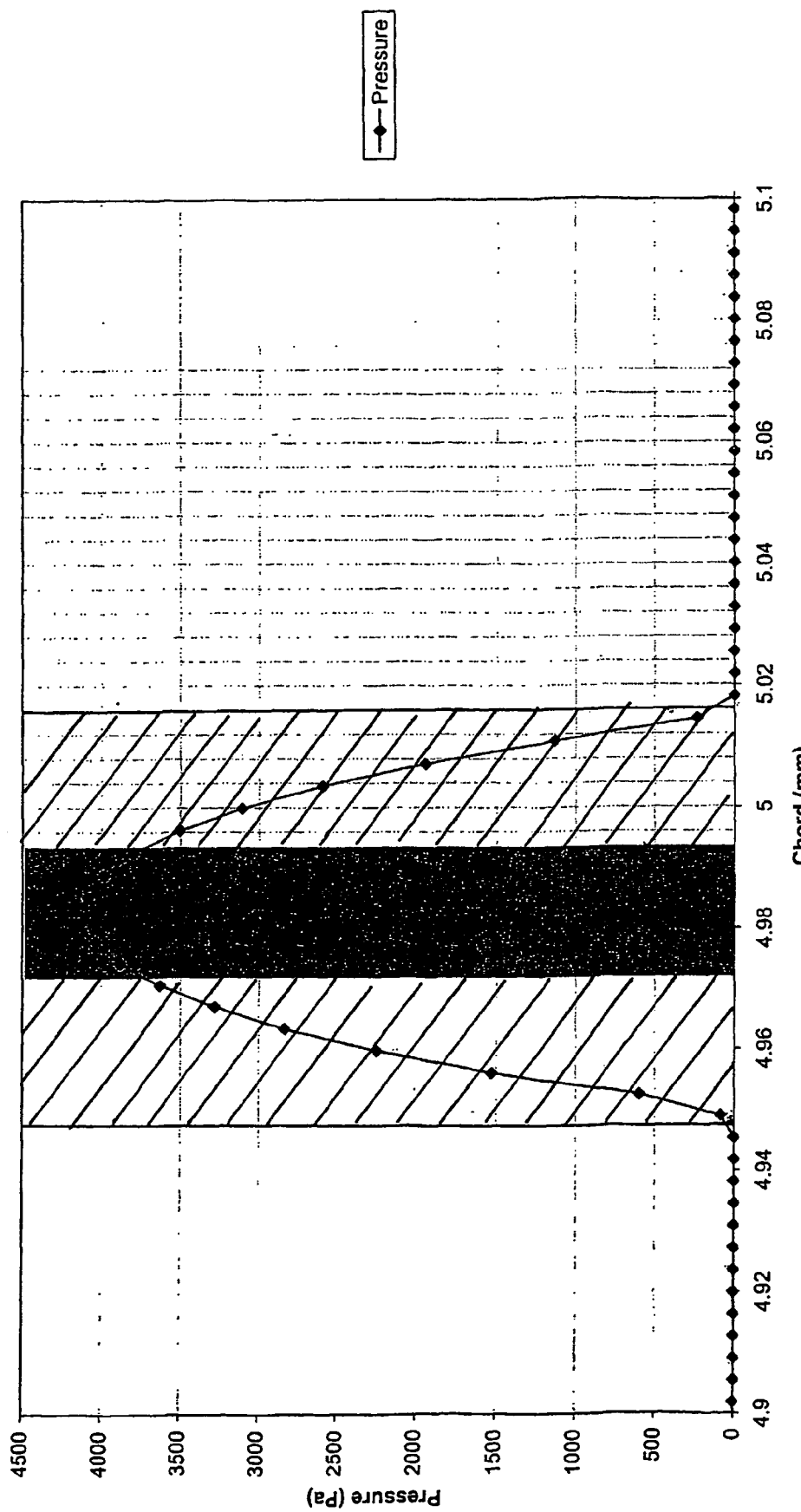
Figure 10:
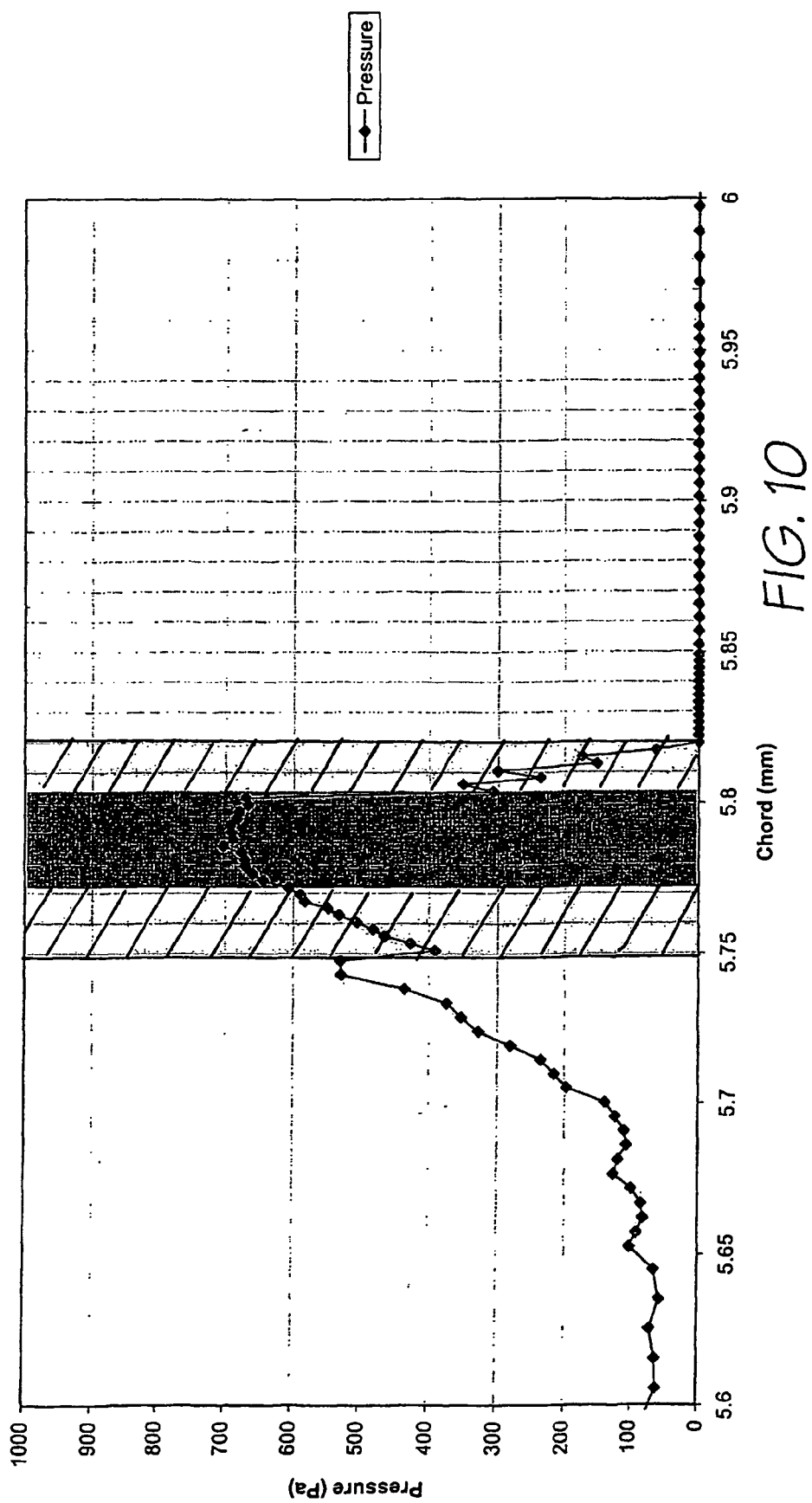
Figure 11:
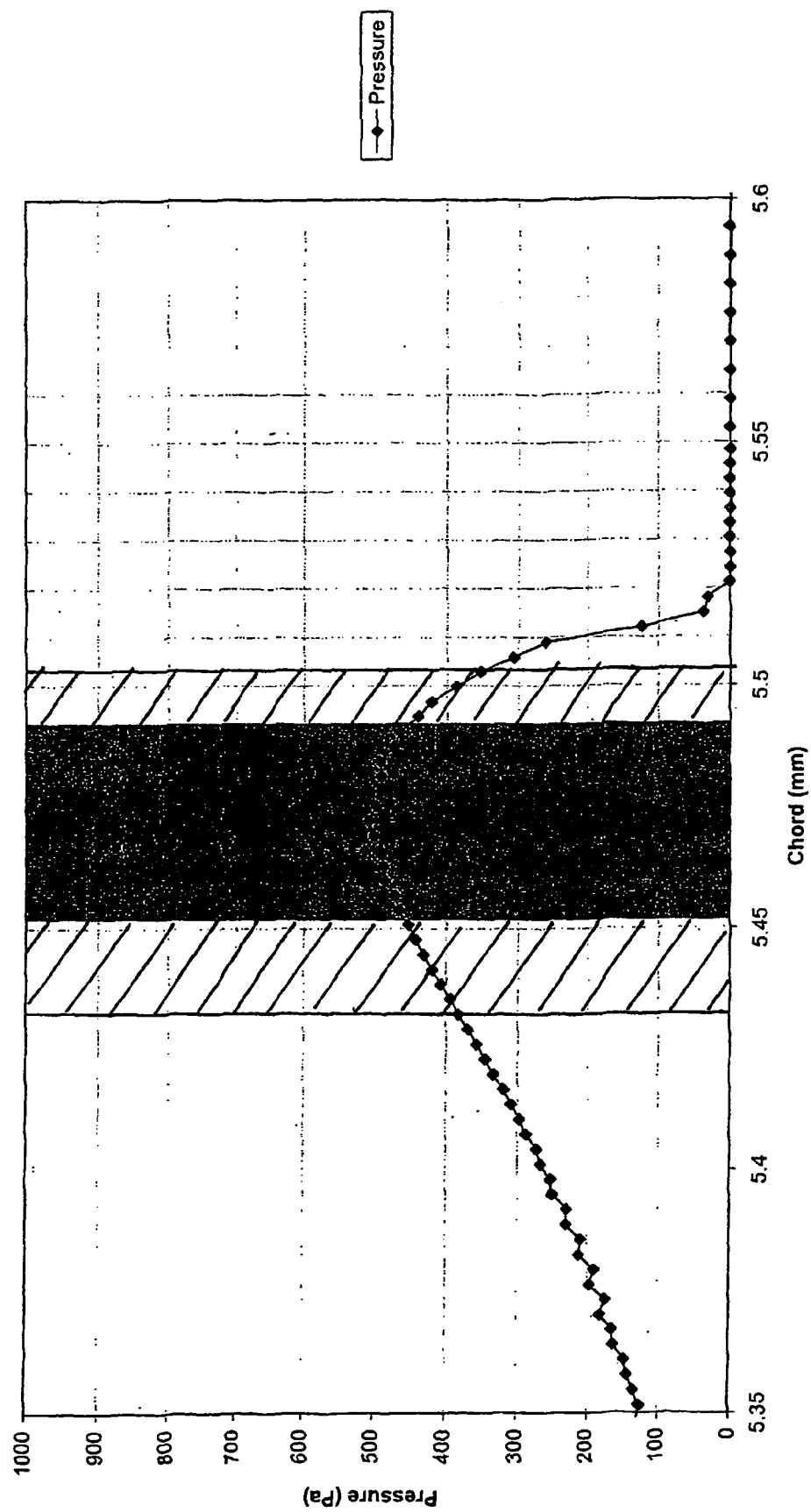
Figure 12:
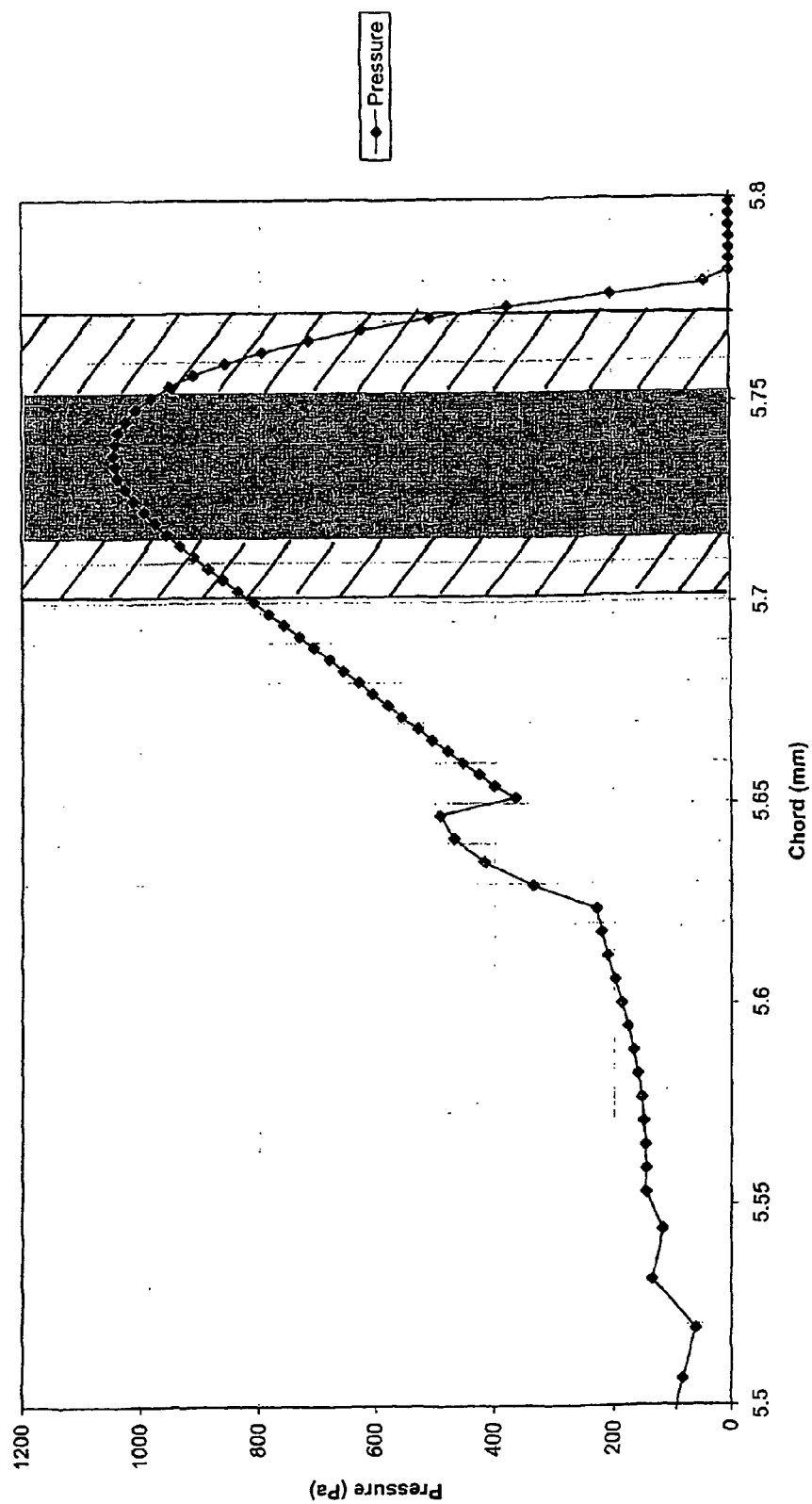

The importance of selecting appropriately fine mesh resolution, particularly around anticipated problem areas of the lens, is illustrated with reference to FIGS. 8 to 12 depict a pressure peak adjacent the limbus. FIGS. 8 and 9 depict two pressure peaks for lens "A" at different positions on the eye. FIGS. 10, 11 and 12 depict pressure peaks in the limbus region for lenses "B", "C" and "D" respectively.

Post-lens pressure peaks may be quite narrow, requiring careful attention to mesh resolution in such areas. An over-coarse mesh is likely to underestimate peak magnitude by averaging peak pressure with pressures in regions substantially below the peak.

The pressure peaks shown are calculated with a high-resolution mesh (element spacing=1/32 of lens thickness, or approx. 0.003 mm, close to peak areas; away from peaks, mesh is coarsened to keep total number of elements manageable).

Two zones of interest have been marked on each plot:

(1) A "10% zone" (dark shaded area), in which pressure values are within 10% of those at the peak. To ensure an accurate estimate of peak pressure, it is desirable that at least one lens element—the one at which the peak is recorded—should lie entirely within this zone.

(2) A 0.035 mm radius of the peak (cross-hatched area), corresponding to the resolution that would be obtained by evenly spacing 200 elements along the modelled half-diameter of the lens.

Examination of these plots will show that the "10% zone" is between 0.02 mm and 0.04 mm wide for these examples. As mentioned above, for accurate estimation of peak pressure, at least one lens element should lie entirely within the 10% zone. This may be ensured if element width (i.e. resolution) is no more than ½ that of the 10% zone.

Further examination shows that an 0.035 mm radius of the peak will encompass a wide range of pressure values—indeed, sometimes dropping almost to zero—clearly indicating that such a resolution is quite inadequate for accurate peak estimation.

These observations lead to the conclusion that mesh resolution near the peak should be 0.01 mm, or finer, to avoid substantial underestimation of peak pressure. (Some lenses may produce narrower peaks than the three example lenses here, in which case even finer resolution may be required.)

For this reason, any pressure calculation must ensure by one means or another than mesh resolution in peak regions is high enough to accurately calculate these peaks.

The importance of selecting appropriately fine mesh resolution, particularly around anticipated problem areas of the lens, is illustrated with reference to FIGS. 8 to 12 depict a pressure peak adjacent the limbus. FIGS. 8 and 9 depict two pressure peaks for lens "A" at different positions on the eye. FIGS. 10, 11 and 12 depict pressure peaks in the limbus region for lenses "B", "C" and "D" respectively.

It will be appreciated by the person skilled in the art that numerous modifications and/or variations may be made to the present invention as shown in the specific embodiments without departing from the spirit or scope of the invention as broadly described. The present embodiments are, therefore, to be considered in all respects to be illustrative and not restrictive.

For example, because the preferred embodiment provides a fairly good representation of the lens in a static closed-eye scenario, it's a good starting point for dynamic analyses (e.g. prediction of decentration and centration during blinking, post-lens tear-mixing, etc.)

In the claims that follow and in the summary of the invention, except where the context requires otherwise due to express language or necessary implication the word "comprising" is used in the sense of "including", i.e. the features specified may be associated with further features in various embodiments of the invention.

The invention claimed is:

1. A system for facilitating contact lens design before manufacture, the system comprising:
   an input unit configured for input of model design parameters based solely on at least one from a group consisting of model designs and model measurements, and
   a processing unit for calculating a post-lens pressure profile based on the model design parameters, the post-lens pressure profile is calculated with respect to a model representation of a standard eye, wherein the post-lens pressure profile is calculated by applying a frictionless sliding contact approximation between the model contact lens and the model eye, wherein the frictionless sliding contact approximation comprises a small distance separation between the lens and the eye;
   wherein the processing unit is arranged, in use, to perform a finite element model calculation allowing for large deflection/non-linear geometry effects in the deformation of a model lens shape, wherein the finite element model calculation utilizes solid elements for modeling the lens shape, wherein the model lens and eye parameters are defined by applying a pressure evenly across the contact lens surface, examining pressure peaks identified from the pressure application, evaluating continuity of the pressure peaks and repeating the process if not acceptably continuous, and analyzing the height of the pressure peaks.

2. A system as claimed in claim 1, wherein a lens material of the contact lens to be modeled is a high oxygen permeability (Dk) material, and the processing unit is arranged to model the lens at an elasticity representative of the intended lens material.

3. A system as claimed in claim 2, wherein the intended lens material is modeled at a Young's modulus value representative of silicone hydrogel of a range from about 0.8 to 2 MPa.

4. A system as claimed in claim 3, wherein the finite element model calculation comprises second order elements, whereby, in use, second-order properties of the model lens are considered by the system.

5. A system as claimed in claim 3, wherein the processing unit is arranged, in use, such that a 2-D axisymmetric geometry is applied to a lens/eye interaction problem in the calculation of the post-lens pressure profile.

6. A system as claimed in claim 3, wherein the processing unit is arranged, in use, to calculate the post-lens pressure profile based on a closed eye, steady-state finite element model calculation.

7. A system as claimed in claim 3, wherein the corneoscleral surface is represented as a rigid body in the finite element model calculation.

8. A system as claimed in claim 3, wherein a shape of the comeoscleral surface is approximated based on an ellipsoid-and-sphere formulation in the finite element model calculation.

9. A method of calculating a post-lens pressure profile based on model design parameters based solely on at least one from a group consisting of model designs and model measurements, comprising performing a finite element model calculation allowing for large deflection/non-linear geometry effects in the deformation of a model lens shape, wherein the finite element model calculation utilizes solid elements for modeling the lens shape, wherein the post-lens pressure profile is calculated before manufacture with respect to a model representation of a standard eye, wherein the post-lens pressure profile is calculated by applying a frictionless sliding contact approximation between the model contact lens and the model eye, wherein the frictionless sliding contact approximation comprises a small distance separation between the lens and the eye, wherein the model lens and eye parameters are defined by applying a pressure evenly across the contact lens surface, examining pressure peaks identified from the pressure application, evaluating continuity of the pressure peaks and repeating the process if not acceptably continuous, and analyzing the height of the pressure peaks.

10. A method as claimed in claim 9, wherein a lens material of the contact lens to be modeled is a high oxygen permeability (Dk) material, and the lens is modeled at an elasticity representative of the intended lens material.

11. A method as claimed in claim 10, wherein the intended lens material is modeled at a Young's modulus value representative of silicone hydrogel of a range from about 0.8 to 2 MPa.

12. A method as claimed in claim 11, wherein the finite element model calculation comprises second order elements, whereby second-order properties of the model lens are considered.

13. A method as claimed in claim 11, wherein a 2-D axisymmetric geometry is applied to a lens/eye interaction problem in the calculation of the post-lens pressure profile.

14. A method as claimed in claim 11, wherein the post-lens pressure profile is based on a closed eye, steady-state finite element model calculation.

15. A method as claimed in claim 11, wherein the comeoscleral surface is represented as a rigid body in the finite element model calculation.

16. A method as claimed in claim 11, wherein a shape of the comeoscleral surface is approximated based on an ellipsoid-and-sphere formulation in the finite element model calculation.

* * * * *